(12) United States Patent
Waechter et al.

(10) Patent No.: US 10,566,490 B2
(45) Date of Patent: Feb. 18, 2020

(54) RECEIVER UNIT

(71) Applicant: AZUR SPACE SOLAR POWER GMBH, Heilbronn (DE)

(72) Inventors: Clemens Waechter, Lauffen am Neckar (DE); Daniel Fuhrmann, Heilbronn (DE); Wolfgang Guter, Stuttgart (DE); Christoph Peper, Hannover (DE)

(73) Assignee: Azur Space Solar Power GmbH, Heilbronn (DE)

( * ) Notice: Subject to any disclaimer, the term of this patent is extended or adjusted under 35 U.S.C. 154(b) by 40 days.

(21) Appl. No.: 16/059,450

(22) Filed: Aug. 9, 2018

(65) Prior Publication Data

US 2018/0351026 A1 Dec. 6, 2018

Related U.S. Application Data

(63) Continuation of application No. PCT/EP2017/000121, filed on Feb. 2, 2017.

(30) Foreign Application Priority Data

Feb. 9, 2016 (DE) .......................... 10 2016 001 387

(51) Int. Cl.
*H01L 31/167* (2006.01)
*H01L 31/0304* (2006.01)
*H01L 27/142* (2014.01)

(52) U.S. Cl.
CPC .......... *H01L 31/167* (2013.01); *H01L 27/142* (2013.01); *H01L 31/0304* (2013.01); *Y02E 10/544* (2013.01)

(58) Field of Classification Search
None
See application file for complete search history.

(56) References Cited

U.S. PATENT DOCUMENTS

| 4,127,862 A | 11/1978 | Ilegems et al. |
| 4,766,471 A | 8/1988 | Ovshinsky et al. |

(Continued)

FOREIGN PATENT DOCUMENTS

| DE | 40 05 835 A1 | 8/1990 |
| DE | 10 2010 001 420 A1 | 8/2014 |

(Continued)

OTHER PUBLICATIONS

Kalkhoran et al., "Cobalt disillicide intercell ohmic contacts for multijunction photovoltaic energy converters," Appl. Phys. Letts., vol. 64, No. 15 (Apr. 11, 1994).

(Continued)

*Primary Examiner* — Seahvosh Nikmanesh
(74) *Attorney, Agent, or Firm* — Muncy, Geissler, Olds & Lowe, P.C.

(57) ABSTRACT

A receiver component having a number of partial voltage sources implemented as semiconductor diodes connected to one another in series, so that the number of partial voltage sources generate a source voltage, and each of the partial voltage sources has a semiconductor diode with a p-n junction, and the semiconductor diode has a p-doped absorption layer. The p absorption layer is passivated by a p-doped passivation layer with a larger band gap than the band gap of the p absorption layer, and the semiconductor diode has an n absorption layer that is passivated by an n-doped passivation layer with a larger band gap than the band gap of the n absorption layer. The partial source voltages of the individual partial voltage sources have a deviation of less than 20% from one another, and a tunnel diode is formed between each sequential pair of partial voltage sources.

18 Claims, 4 Drawing Sheets

(56) References Cited

U.S. PATENT DOCUMENTS

| | | | |
|---|---|---|---|
| 4,996,577 | A | 2/1991 | Kinzer |
| 5,644,156 | A | 7/1997 | Suzuki et al. |
| 6,239,354 | B1 | 5/2001 | Wanlass |
| 6,927,413 | B2 | 8/2005 | Mears et al. |
| 8,350,208 | B1 | 1/2013 | Zhang et al. |
| 2006/0048811 | A1 | 3/2006 | Krut et al. |
| 2011/0005570 | A1 | 1/2011 | Jain |
| 2015/0162478 | A1 | 6/2015 | Fafard et al. |
| 2016/0343704 | A1* | 11/2016 | Fuhrmann ............ H01L 23/3171 |
| 2016/0365470 | A1* | 12/2016 | Guter ................ H01L 31/03046 |
| 2017/0084757 | A1* | 3/2017 | Fuhrmann ............... H01L 29/88 |
| 2018/0145188 | A1* | 5/2018 | Fuhrmann ............. H01L 21/308 |
| 2018/0241478 | A1* | 8/2018 | Guter ................ H01L 31/02019 |
| 2018/0374982 | A1* | 12/2018 | Koestler ............. H01L 31/1013 |

FOREIGN PATENT DOCUMENTS

| | | |
|---|---|---|
| EP | 1 134 813 A2 | 9/2001 |
| JP | H 08-148280 A | 6/1996 |
| JP | 2007-521646 A | 8/2007 |
| WO | WO 2013/067969 A1 | 5/2013 |

OTHER PUBLICATIONS

Bett et al., "III-V Solar Cells Under Monochromatic Illumination," 33rd IEEE Photovoltaic Spec. Conf., pp. 1-5 (2008).

* cited by examiner

RECEIVER UNIT

This nonprovisional application is a continuation of International Application No. PCT/EP2017/000121, which was filed on Feb. 2, 2017, and which claims priority to German Patent Application No. 10 2016 001 387.7, which was filed in Germany on Feb. 9, 2016, and which are both herein incorporated by reference.

BACKGROUND OF THE INVENTION

Field of the Invention

The present invention relates to a receiver unit

Description of the Background Art

Receiver components are known in optocouplers. Simple optocouplers have a transmitter component and a receiver component, wherein the two components are galvanically isolated, but optically coupled. Embodiments of this nature are known from U.S. Pat. No. 4,996,577. Optical devices are also known from US 2006/0048811 A1, from U.S. Pat. No. 8,350,208 B1 and from WO 2013/067969 A1. Receiver components that include multi-junction solar cells are known from US 2011/0005570 A1 and from DE 40 05 835 A1.

In addition, scalable voltage sources and also solar cells made of III-V materials are known from U.S. Pat. No. 4,127,862, from U.S. Pat. No. 6,239,354 B1, from DE 10 2010 001 420 A1, from "Cobalt disilicide intercell ohmic contacts for multijunction photovoltaic energy converters," by Nader M. Kalkhoran, et al., Appl. Phys. Lett. 64, 1980 (1994), and from "III-V solar cells under monochromatic illumination," by A. Bett et al., Photovoltaic Specialists Conference, 2008, PVSC '08. 33rd IEEE, page 1-5, ISBN: 978-1-4244-1640-0.

SUMMARY OF THE INVENTION

It is therefore an object of the present invention to provide a device that advances the state of the art.

In an exemplary embodiment of the invention, a receiver component is provided, having a number N of partial voltage sources implemented as semiconductor diodes connected to one another in series, so that the number N of partial voltage sources generate a source voltage.

Each of the partial voltage sources has a semiconductor diode with a p-n junction, wherein the semiconductor diode has a p-doped absorption layer. The p absorption layer is passivated by a p-doped passivation layer with a larger band gap than the band gap of the p absorption layer.

The semiconductor diode has an n absorption layer, wherein the n absorption layer is passivated by an n-doped passivation layer with a larger band gap than the band gap of the n absorption layer.

The partial source voltages of the individual partial voltage sources can have a deviation of less than 20% from one another. A tunnel diode is formed between each sequential pair of partial voltage sources, wherein the partial voltage sources and the tunnel diodes are monolithically integrated together, and jointly form a first stack with a top and a bottom.

The number N of partial voltage sources can be greater than or equal to two, and light strikes the top of the first stack on the surface of one of the semiconductor diodes. The first stack has a first electrical contact on the surface, and has a second electrical contact on the bottom.

The first stack has a total thickness of less than 12 µm, and can be arranged on a semiconductor substrate, wherein the semiconductor substrate is monolithically connected to the stack and to a transistor.

The control input of the transistor can be connected to one of the two electrical contacts.

In the event of illumination with modulated light, the receiver component can generate a modulated DC voltage. The entire top of the diode can be formed at the top of the stack is irradiated with light. It is also a matter of course that the photon energy of the light corresponding to the wavelength of the light is at least greater than or equal to the band gap energy of the absorption layers of the semiconductor diodes.

The term "light with a specific wavelength" can mean, in particular, the light of an LED, and in this context the emission spectrum is generally Gaussian and has, for example, a full width at half maximum of 20-30 nm for a typical 850 nm LED. Preferably, the receiver component is only absorbing in the infrared range at approximately 850 nm.

It is noted that, surprisingly, that in contrast to the prior art, source voltages above 2V advantageously result with the present monolithic stack approach.

The number N of partial voltage sources can be less than ten, and that the value of the source voltage of the first stack is determined predominantly from the addition of the partial source voltages.

The receiver component does not have to have a multiple quantum well structure. It is a matter of course that the transistor also does not have to have a multiple quantum well structure.

An advantage of the device according to the invention is that a voltage source with voltage values even above four or more volts can be realized by series-connecting a multiplicity of partial voltage sources, and a simple, economical, and reliable voltage source for power supply to the transistor that is connected to the at least one contact of the stack can be produced by means of a monolithically integrated structure.

Another advantage is that the stacked arrangement results in a great saving in area as compared to the previous lateral arrangement with silicon diodes. In particular, only the considerably smaller receiving area of the first stack of the receiver component must be illuminated by the source diode or the light source in order to generate the energy for the supply to the transistor.

The transistor can be arranged on the surface of the first stack or laterally adjacent to the first stack. The transistor can be implemented as a lateral or vertical component. In another improvement, the transistor is arranged between the first stack and the substrate.

A spacing is formed between the transistor and the first stack. The transistor can be formed as part of an integrated circuit.

The size of the illuminated surface on the stack top can correspond essentially to the size of the area of the first stack on the top. In one improvement, the first stack has, at 300 K, a source voltage of greater than 2.3 volts as long as the first stack is irradiated with light with a certain wavelength, and wherein the total thickness of the p and n absorption layers of a semiconductor diode increases from the topmost diode to the bottommost diode in the direction of incident light from the top of the first stack to the bottom of the first stack.

In an embodiment, the partial source voltages of the partial voltage sources of the receiver component have a deviation of less than 10% from one another.

The semiconductor diodes of the receiver component each can have the same semiconductor material. The term "the same semiconductor materials" can include such semiconductor compounds as have the same elements. It is a matter of course that the same semiconductor compounds in this context can also contain different stoichiometries and different dopants.

The first stack has a base area smaller than 2 mm$^2$ or smaller than 1 mm$^2$. A first contact can be formed on the top of the first stack as a continuous, metal contact in the vicinity of the edge or as a single contact area on the edge. The second contact can be formed by the substrate.

The receiver component can have a second stack. The first stack and the second stack can be arranged next to one another on the substrate. The two stacks are connected to one another in series so that the source voltage of the first stack and the source voltage of the second stack add together.

An intrinsic layer can be formed between the p absorption layer and the n absorption layer in at least one of the semiconductor diodes. The semiconductor material of the semiconductor diodes and of the transistor and/or the substrate of the receiver component can be made of III-V materials. The substrate of the receiver component can include or is made of germanium or gallium arsenide.

The semiconductor layers of the stack of the receiver component simultaneously include arsenide-containing layers and phosphide-containing layers.

The voltage source can have a continuous, shoulder-like edge in the vicinity of the bottom of the stack of the receiver component. An edge of this nature can also be referred to as a step.

The tunnel diode can have, between the semiconductor diodes, multiple semiconductor layers with a higher band gap than the band gap of the p/n absorption layers of the semiconductor diodes. The semiconductor layers with the higher band gap can each be made of a material with modified stoichiometry and/or a different elemental composition than the p/n absorption layers of the semiconductor diode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
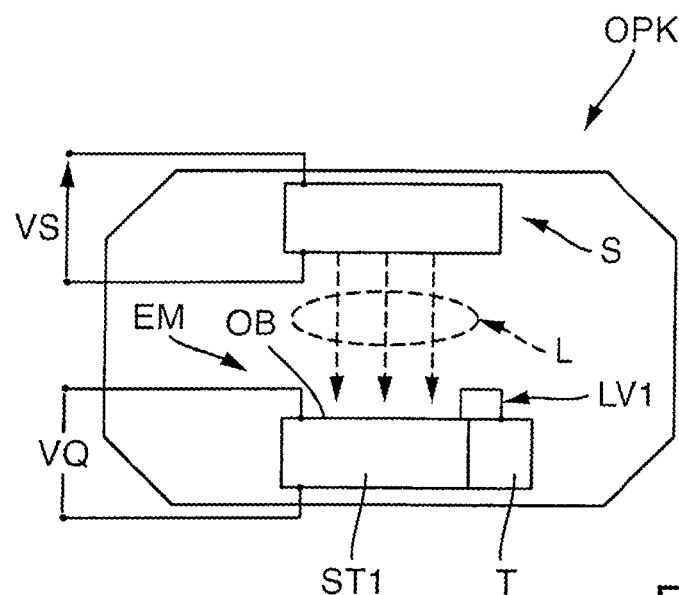
FIG. 1 illustrates a receiver component integrated with a transmitter component in a package as an optocoupler.

The illustration in FIG. 1 shows a receiver component EM integrated with a transmitter component S in a package as an optocoupler OPK. The transmitter component S has two electrical terminals for applying the supply voltage VS.

The receiver component EM has a first stack ST1 with a surface OB and has a transistor T. The light L of the transmitter unit S is incident on the surface OB of the first stack ST1 in a nearly vertical direction.

The first stack ST1 has a multiplicity of series-connected diodes and is implemented as a scalable voltage source VQ. The first stack ST1 is connected to the transistor T by means of a first line LV1. It is a matter of course that the term "scalability" refers to the value of the source voltage of the entire first stack ST1. It is a matter of course that the optocoupler OPK in the present case is packaged, which is to say that the said components are integrated into one common package.

Figure 2:
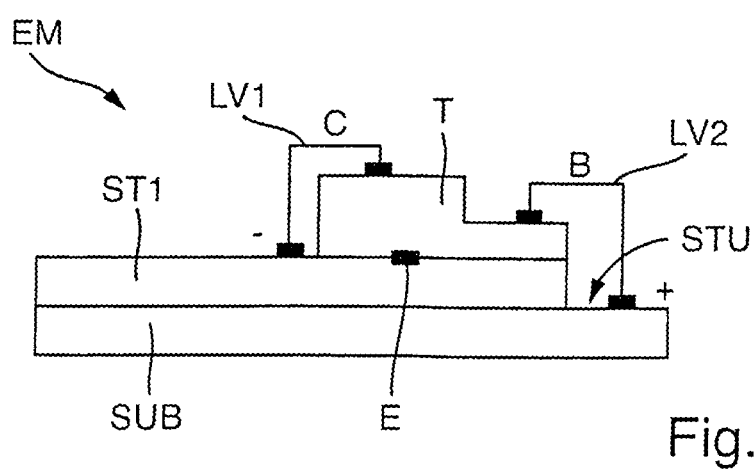
FIG. 2 is a representation of the receiver unit EM in an embodiment.

In the illustration in FIG. 2, a detailed representation of the receiver unit EM in an embodiment is shown. Only the differences from FIG. 1 are explained below.

The first stack ST1 is arranged on a substrate SUB can be made of Ge. The transistor T is arranged directly on the surface OB of the first stack ST1. In the present case, the transistor T, which is implemented as a bipolar, vertical component, has an emitter E and a base B and a collector C. It is a matter of course that a corresponding doped semiconductor layer is also associated in each case with the emitter E, with the base B, and with the collector C of the transistor T. In the present case, the base B is arranged above the emitter E and below the collector C. Formed between the collector C and the base B is a step, which is to say the base layer is etched free for contacting.

The emitter E is integrally arranged on the surface OB of the first stack ST1. The collector C on the top of the transistor T and the surface OB of the first stack ST1, which is to say a first contact of the voltage source VQ, are routed to the outside. The base B of the transistor T, to which a positive potential is applied, is connected to the substrate layer SUB, which is to say to a second contact of the voltage source VQ, by means of a second line LV2. For contacting, the substrate layer SUB has a shoulder STU.

The substrate layer SUB and the first stack ST1 and the transistor T form a stacked, monolithic arrangement.

Figure 3:
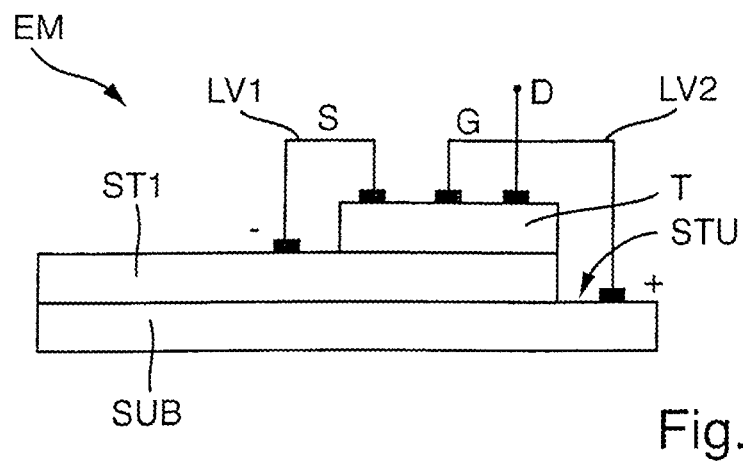
FIG. 3 is a representation of the receiver unit EM in an embodiment.

FIG. 3 shows a representation of the receiver unit EM in an embodiment. Only the differences from FIG. 2 are explained below.

The transistor T arranged directly on the surface OB of the first stack ST1 is implemented as a lateral MOS component with a source S and a gate G and a drain D. The source S of the top of the transistor T, to which a negative potential is applied, is connected to the surface OB of the first stack ST1, which is to say to the first contact of the voltage source VQ, by means of the first line LV1. The gate G of the transistor T, to which a positive potential is applied, is connected to the substrate layer SUB, which is to say to the second contact of the voltage source VQ, by means of a second line LV2.

Figure 4:
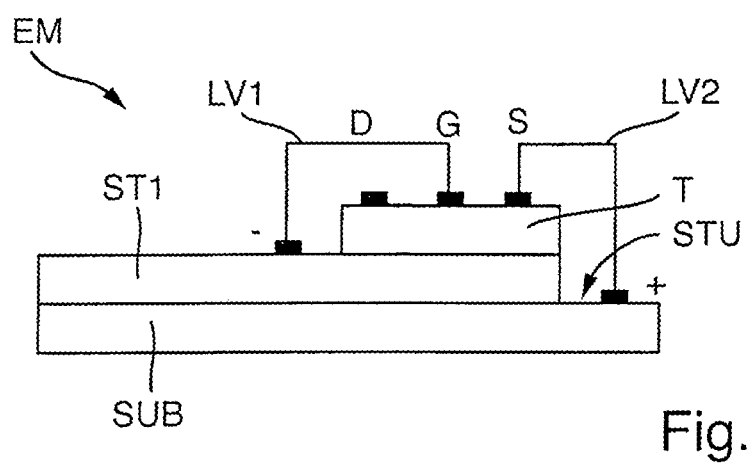
FIG. 4 is a representation of the receiver unit EM in an embodiment.

FIG. 4 shows a representation of the receiver unit EM in an embodiment. Only the differences from FIG. 3 are explained below.

The gate G of the top of the transistor T, to which a negative potential is applied, is connected to the surface OB of the first stack ST1, which is to say to the first contact of the voltage source VQ, by means of the first line LV1. The source S of the transistor T, to which a positive potential is applied, is connected to the substrate layer SUB, which is to say to the second contact of the voltage source VQ, by means of a second line LV2.

Figure 5:
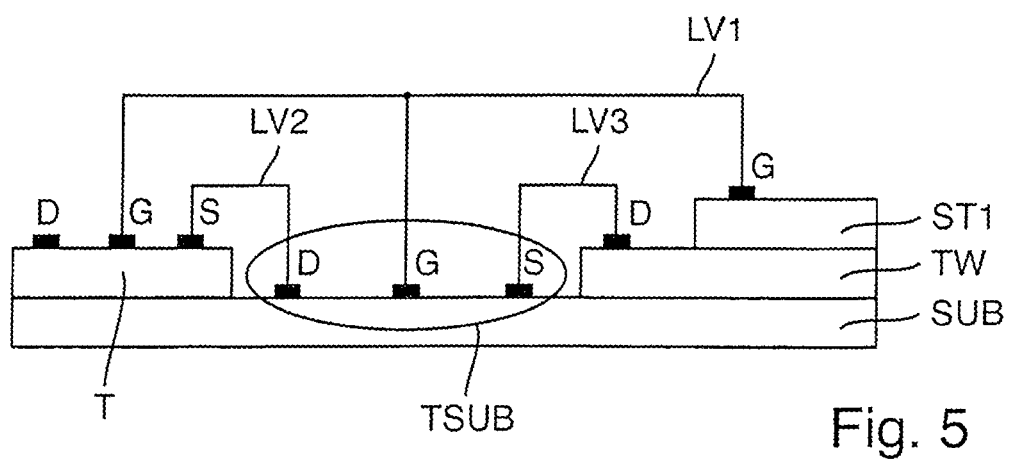
FIG. 5 is a representation of the receiver unit EM in an embodiment.

FIG. 5 shows a representation of the receiver unit EM in a fourth embodiment. Only the differences from FIGS. 3 and 4 are explained below.

On the substrate layer SUB, an additional lateral MOS substrate transistor TSUB is implemented next to the first transistor T.

The MOS transistors are implemented next to or below the first stack ST1. The gate G of the transistor T is connected by the line LV1 to the surface of the first stack ST1 and to the gate G of the substrate transistor TSUB. The source S of the transistor T is connected by the line LV2 to the drain D of the substrate transistor TSUB. The source S of the substrate transistor TSUB is connected by a line LV3 to the drain D of the additional transistor TW.

Figure 6:
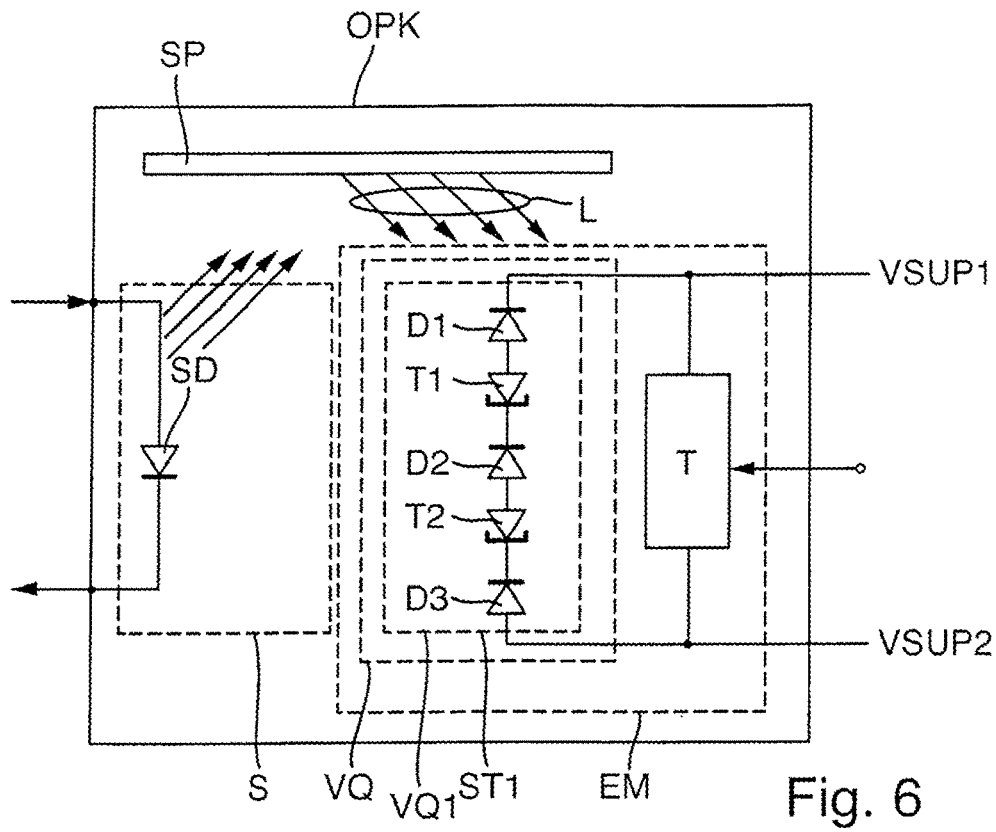
FIG. 6 is a detailed structure of the first stack of the receiver unit EM with a scalable voltage source in a packaged optocoupler.

FIG. 6 shows a detailed structure of the first stack of the receiver unit EM with the scalable voltage source VQ in a packaged optocoupler OPK. Only the differences from the preceding figures are explained below.

The voltage source VQ has the first stack ST1 with a top and a bottom with a number N equal to three diodes. The first stack ST1 has a series circuit having a first diode D1 and a first tunnel diode T1 and a second diode D2 and a second tunnel diode T2 and a third diode D3. Formed on the top of the first stack ST1 is a first voltage terminal VSUP1 and on the bottom of the first stack ST1 is a second voltage terminal VSUP2. The source voltage in the present case is composed predominantly of the partial voltages of the individual diodes D1 to D3. For this purpose, the first stack ST1 is exposed to a photon flux L from a source diode SD of the transmitter unit S by means of a reflecting mirror SP. If the source diode SD emits a modulated photon flux, the source voltage VQ1 of the first stack ST1 is likewise modulated in the first stack ST1.

The first stack ST1, comprising the diodes D1 to D3 and the tunnel diodes T1 and T2, is implemented as a monolithic block. The transistor T is connected to the two voltage terminals VSUP1 and VSUP2. It is a matter of course that the transmitter unit S and the receiver unit EM each have two terminals that are galvanically isolated from one another.

Figure 7:
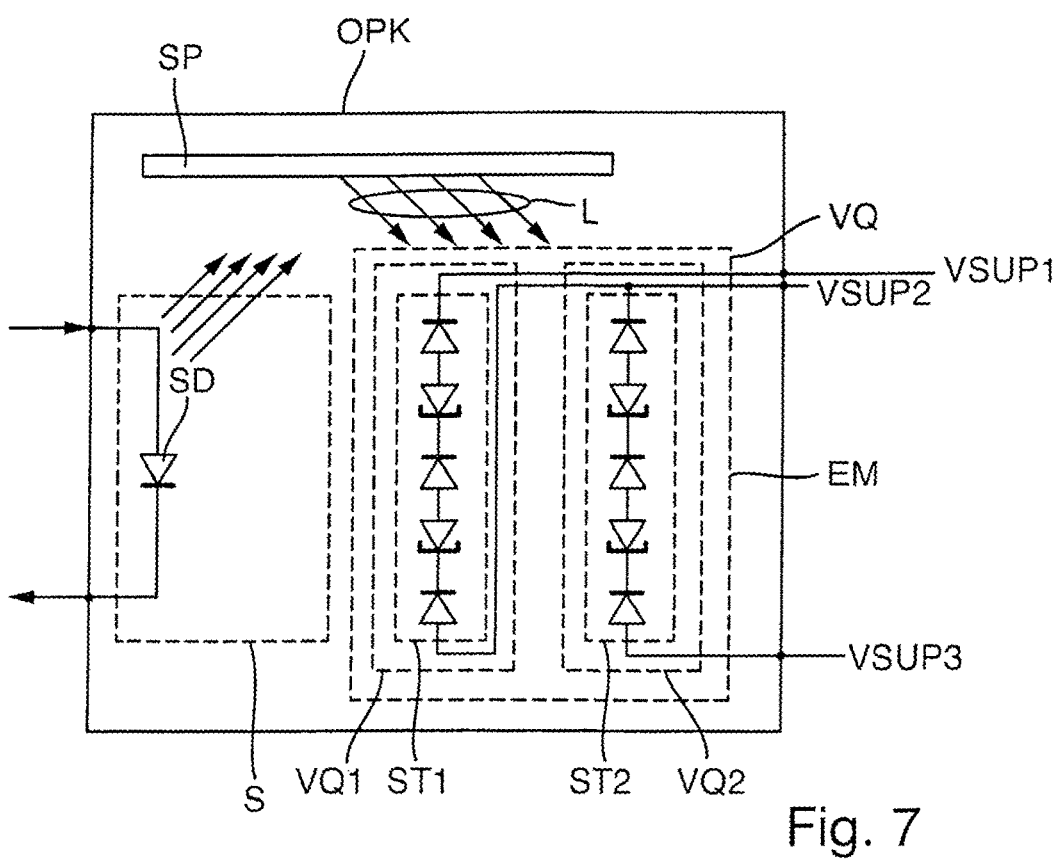
FIG. 7 illustrates an optocoupler with a scalable voltage source with multiple stacks.

FIG. 7 shows another embodiment of the optocoupler from FIG. 6 with an advantageous concatenation of the first stack ST1 and a second stack ST2. Only the differences from the illustration in FIG. 6 are explained below. The second stack ST2, like the first stack ST1, has a series circuit having three diodes with tunnel diodes formed between them. The two stacks ST1 and ST2 are connected in series with one another so that the source voltage VQ1 of the first stack ST1 and the source voltage VQ2 of the second stack ST2 add together as long as the two stacks ST1 and ST2 are exposed to the photon flux L of the source diode SD. The first voltage terminal VSUP1 and the second voltage terminal VSUP2 and the third voltage terminal VSUP3 can be connected in advantageous fashion to a transistor circuit, and in the present case are additionally routed to the outside.

The two stacks ST1 and ST2 can have different numbers of diodes from one another, which are connected in a series circuit in each case. In an embodiment, at least the first stack ST1 and/or the second stack ST2 can have more than three diodes connected in a series circuit. In this way, the voltage level of the voltage source VQ can be scaled. The number N can be in a range between four and eight.

Figure 8:
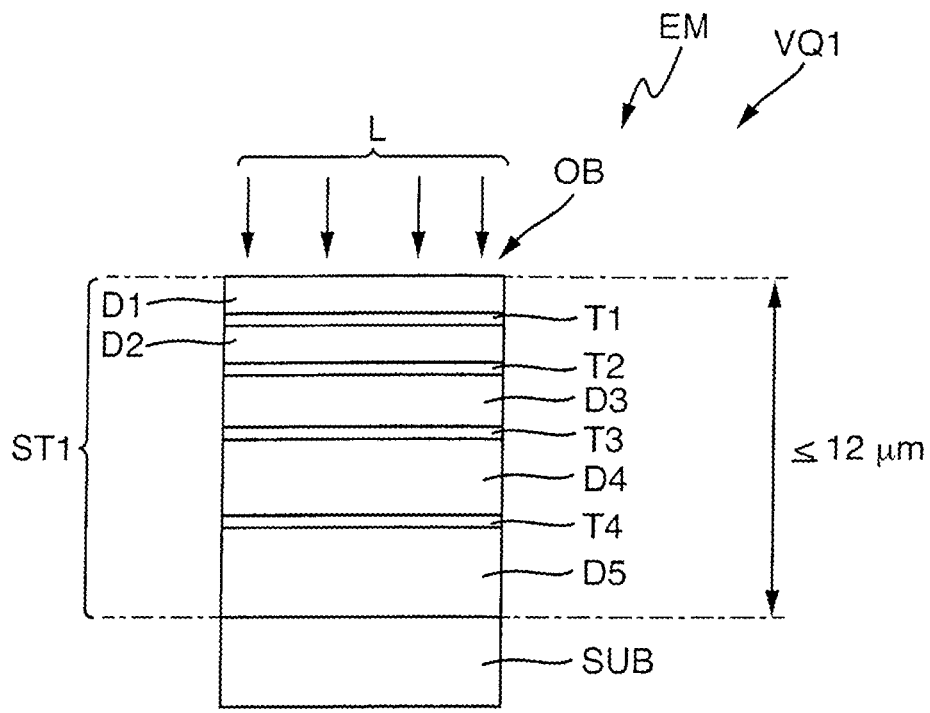
FIG. 8 illustrates an embodiment of the stack ST1 with a total of five diodes with different absorption region thicknesses.

In the illustration in FIG. 8, an embodiment of an advantageous concatenation of semiconductor layers into the first stack ST1 is shown. Only the differences from the illustration in FIG. 6 are explained below. The first stack ST1 comprises a total of five partial voltage sources implemented as diodes D1 to D5 connected in series. The light L is incident on the surface OB of the first diode D1. The surface OB is completely or almost completely illuminated. One tunnel diode T1-T4 is formed between each sequential pair of diodes D1-D5. The thickness of the absorption region increases with increasing distance of the individual diodes D1 to D5 from the surface OB, so that the bottommost diode D5 has the thickest absorption region. Taken as a whole, the total thickness of the first stack ST1 is less than or equal to 12 μm. A substrate SUB is formed beneath the bottommost diode D5.

Figure 9:
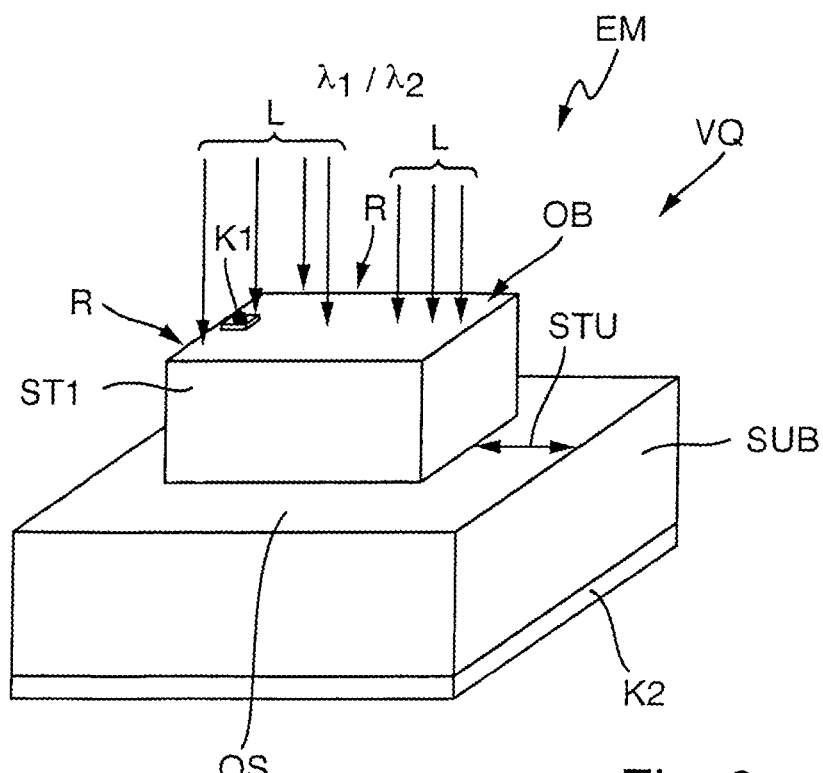
FIG. 9 illustrates a stack with a continuous, shoulder-like step.

In the illustration in FIG. 9, an embodiment of an advantageous concatenation of semiconductor layers into the first stack ST1 with a continuous, shoulder-like step is shown. Only the differences from the illustration in the preceding figures are explained below. A first metal terminal contact K1 is formed on the surface OB of the first stack ST1 at the edge R. The first terminal contact K1 is connected to the first voltage terminal VSUP1. The substrate SUB has a top OS, wherein the top OS of the substrate SUB is integrally joined to the bottommost diode, which is to say the fifth diode D5. It is a matter of course here that a thin nucleation layer and a buffer layer are epitaxially produced on the substrate before the fifth diode is arranged on the substrate and integrally joined to the top OS of the substrate. The top OS of the substrate SUB has a larger surface than the area at the bottom of the first stack ST1. In this way, a continuous step STU is formed. A second, full-area metal contact K2 is formed on the bottom of the substrate SUB. The second terminal contact K2 is connected to the second voltage terminal VSUP2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A receiver component comprising:
   a number N of partial voltage sources implemented as semiconductor diodes connected to one another in series, so that a number N of partial voltage sources generate a source voltage, each of the partial voltage sources have a semiconductor diode with a p-n junction, the semiconductor diode having a p-doped absorption layer, the p absorption layer being passivated by a p-doped passivation layer with a larger band gap than a band gap of the p absorption layer, the semiconductor diodes having an n absorption layer that is passivated by an n-doped passivation layer with a larger band gap than a band gap of the n absorption layer; and a tunnel diode formed between each sequential pair of partial voltage sources, wherein the partial voltage sources and the tunnel diodes are monolithically integrated together and jointly form a first stack with a top and a bottom, wherein the number N of partial voltage sources is greater than or equal to two, wherein light strikes the first stack on the top on the surface of the first stack, the first stack having a first electrical contact on the surface and a second electrical contact on the bottom, wherein the first stack has a total thickness of less than 12 μm, wherein the stack is arranged on a semiconductor substrate, wherein a semiconductor material of the semiconductor diodes is made of III-V materials, wherein the substrate of the receiver component includes germanium or gallium arsenide, and wherein a continuous, shoulder-like edge is formed in a vicinity of the bottom of the first stack of the receiver component, wherein the tunnel diode has, between the semiconductor diodes, at least two semiconductor layers with a higher band gap than a band gap of the p/n absorption layers of the semiconductor diodes, wherein the partial source voltages of the individual partial voltage sources have a deviation of less than 20% from one another, wherein the semiconductor substrate is monolithically connected to the stack and to a transistor, wherein a control input of the transistor is connected to one of the two electrical contacts, and wherein the receiver component does not have a quantum well structure.

2. The receiver component according to claim 1, wherein the transistor is arranged on the surface of the first stack or laterally adjacent to the first stack.

3. The receiver component according to claim 1, wherein the transistor is arranged between the first stack and the substrate.

4. The receiver component according to claim 1, wherein a spacing is formed between the transistor and the first stack.

5. The receiver component according to claim 1, wherein the transistor is formed as part of an integrated circuit.

6. The receiver component according to claim 1, wherein a size of an illuminated surface on the stack top corresponds essentially to a size of an area of the first stack on the top.

7. The receiver component according to claim 1, wherein the first stack has, at 300 K, a source voltage of greater than 2.3 volts as long as the first stack is irradiated with light with a certain wavelength, and wherein a total thickness of the p and n absorption layers of a semiconductor diode increases from a topmost diode to a bottommost diode in a direction of incident light from the top of the first stack to the bottom of the stack.

8. The receiver component according to claim 1, wherein the partial source voltages of the partial voltage sources of the receiver component have a deviation of less than 10% from one another.

9. The receiver component according to claim 1, wherein the semiconductor diodes of the receiver component each have the same semiconductor material.

10. The receiver component according to claim 1, wherein the first stack has a base area smaller than 2 mm$^2$ or smaller than 1 mm$^2$.

11. The receiver component according to claim 1, wherein a first contact is formed on the top of the first stack as a continuous, metal contact in a vicinity of an edge or as a single contact area on the edge.

12. The receiver component according to claim 1, wherein the second contact is formed by the substrate.

13. The receiver component according to claim 1, wherein a second stack is formed in the receiver component, wherein the first stack and the second stack are arranged next to one another on the substrate, wherein the first and second stacks are connected to one another in series so that the source voltage of the first stack and the source voltage of the second stack add together.

14. The receiver component according to claim 1, wherein an intrinsic layer is formed between the p absorption layer and the n absorption layer in one of the semiconductor diodes of the receiver component.

15. The receiver component according to claim 1, wherein the semiconductor layers of the stack of the receiver component include arsenide-containing layers and phosphide-containing layers.

16. The receiver component according to claim 1, wherein, in the tunnel diode, the semiconductor layers with a higher band gap are each made of a material with modified stoichiometry and/or a different elemental composition than the p/n absorption layers of the semiconductor diode.

17. The receiver component according to claim 1, wherein the transistor is a lateral or vertical component.

18. The receiver component according to claim 1, wherein the receiver component and the transistor do not have a multiple quantum well structure.

* * * * *